(12) United States Patent
Yang

(10) Patent No.: US 8,614,120 B2
(45) Date of Patent: Dec. 24, 2013

(54) SEMICONDUCTOR CHIP PACKAGE AND METHOD OF MAKING SAME

(75) Inventor: Jun Yang, Zhongshan (CN)

(73) Assignee: Ambit Microsystems (Zhongshan) Ltd., Zhongshan (CN)

( * ) Notice: Subject to any disclaimer, the term of this patent is extended or adjusted under 35 U.S.C. 154(b) by 0 days.

(21) Appl. No.: 13/286,094

(22) Filed: Oct. 31, 2011

(65) Prior Publication Data

US 2013/0075879 A1 Mar. 28, 2013

(30) Foreign Application Priority Data

Sep. 23, 2011 (CN) .......................... 2011 1 0288553

(51) Int. Cl.
*H01L 21/00* (2006.01)

(52) U.S. Cl.
USPC ........... 438/126; 438/125; 257/659; 257/660; 257/E23.114; 257/E23.115

(58) Field of Classification Search
USPC .................. 257/659, 660, E23.115, E23.114; 438/125, 126
See application file for complete search history.

(56) References Cited

U.S. PATENT DOCUMENTS

2009/0184403 A1* 7/2009 Wang et al. .................... 257/659

* cited by examiner

*Primary Examiner* — Amar Movva
(74) *Attorney, Agent, or Firm* — Altis & Wispro Law Group, Inc.

(57) ABSTRACT

A semiconductor chip package includes a substrate unit, a chip, metal members, a molding compound and a shielding layer. The chip is assembled on and electrically connected with the substrate unit. The substrate unit includes conductive seat portions surrounding the chip, and defines through holes respectively coated by conducting films to ground the corresponding seat portions. The metal members are assembled on the seat portions, surround the chip, and are grounded through the conducting films. The molding compound encapsulates the chip and the metal members, with part of each metal member exposed out of the molding compound. The shielding layer covers the molding compound and the parts of each metal member exposed out of the molding compound to shield the chip from electromagnetic radiation.

20 Claims, 6 Drawing Sheets

SEMICONDUCTOR CHIP PACKAGE AND METHOD OF MAKING SAME

BACKGROUND

1. Technical Field

The present disclosure relates to semiconductor chip packages, and more particularly to an electromagnetic interference (EMI) shielded semiconductor chip package and a method for making the same.

2. Description of Related Art

As known in the art, electrical communication chips such as radio frequency (RF) packages are prone to be disturbed by electromagnetic interference (EMI). Therefore when RF packages are arranged on a printed circuit board during manufacturing, much attention is required to avoid the RF packages being damaged by other electrical elements.

Generally, a semiconductor chip package comprises a die pad, a chip disposed on the die pad, and a set of leads surrounding the die pad. The chip is electrically connected to the leads via bonding wires. In order to shield the chip from electromagnetic radiation that may cause EMI, a conventional method involves employing a shielding element to cover and shield the chip. The shielding element is connected to the leads and grounded to shield electromagnetic radiation. In order to protect the chip, a molding compound is used to encapsulate the chip and the bonding wires to protect these elements from damage.

The above-described semiconductor chip package has the advantage of being able to shield the chip from external electromagnetic radiation that may cause EMI. However, the semiconductor chip package still requires an additional shield element inside. This increases the cost and complexity of the semiconductor chip package.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
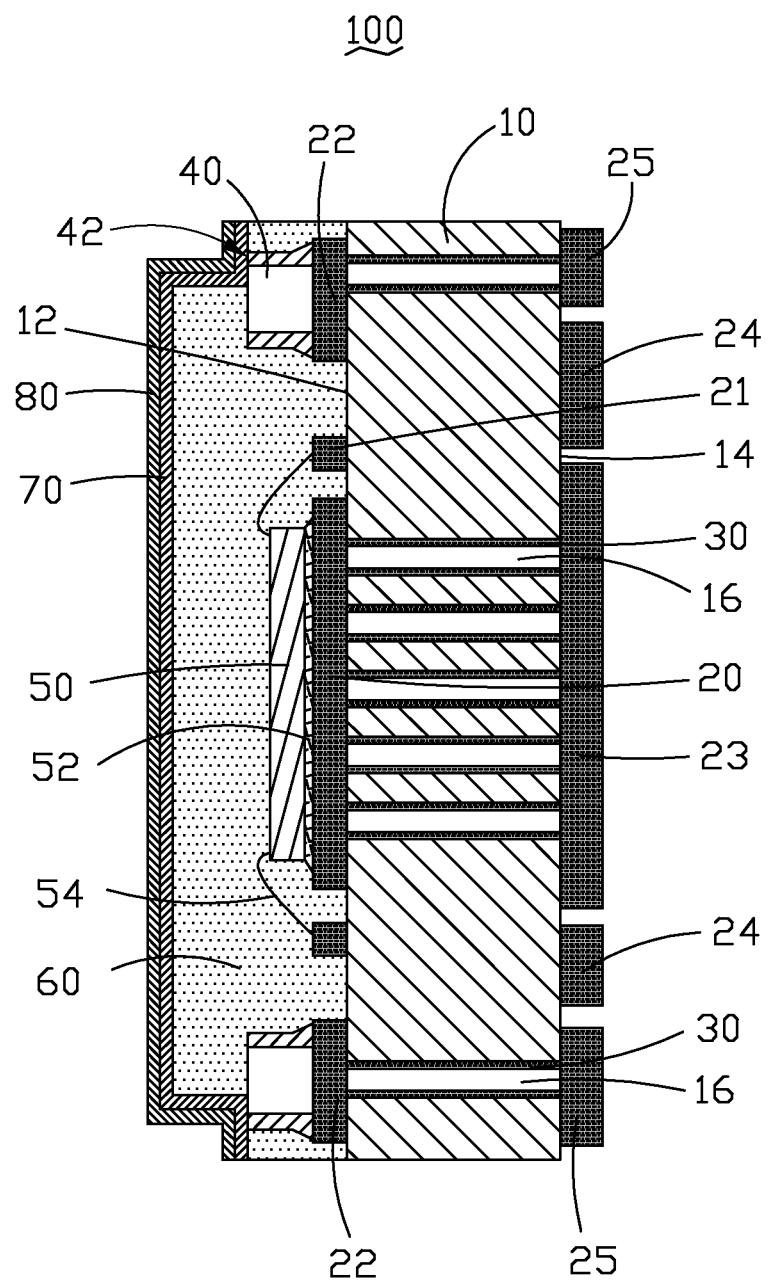
FIG. 1 is a cross-sectional view of an exemplary embodiment of an electromagnetic interference (EMI) shielded semiconductor chip package in accordance with the present disclosure.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

Referring to FIG. 1, a semiconductor chip package 100 comprises a substrate unit 10, a plurality of metal members 40, a chip 50, a molding compound 60, a shielding layer 70 and a protecting layer 80.

The substrate unit 10 comprises a first surface 12 and a second surface 14 at opposite sides thereof. A first seat portion 20, a plurality of first bonding pads 21, and a plurality of second seat portions 22 are configured on the first surface 12. A first connecting portion 23, a plurality of second bonding pads 24, and a plurality of second connecting portions 25 are configured on the second surface 14. The plurality of first bonding pads 21 are positioned between the first seat portion 20 and the plurality of second seat portions 22, and surround the first seat portion 20. The plurality of second bonding pads 24 are positioned between the first connecting portion 23 and the plurality of second connecting portions 25, and surround the first connecting portion 23. The first seat portion 20 is opposite to the first connecting portion 23, the plurality of first bonding pads 21 are respectively generally opposite to the corresponding second bonding pads 24, and the plurality of second seat portions 22 are respectively opposite to the corresponding second connecting portions 25.

In the present embodiment, the first seat portion 20, the plurality of first bonding pads 21, the plurality of second seat portions 22, the first connecting portion 23, the plurality of second bonding pads 24, and the plurality of second connecting portions 25 are made of electrically conductive material.

In the present embodiment, the first seat portion 20, the first connecting portion 23, the plurality of first bonding pads 21, and the plurality of second bonding pads 24 are manufactured by the same processes, such as electroplating processes.

In other embodiments, the first seat portion 20 is made of electrically conductive material having a similar coefficient of heat expansion with the chip 50.

The substrate unit 10 defines a plurality of through holes 16 passing from the first surface 12 to the second surface 14. A conducting film 30 is coated on an inner wall of each of the through holes 16. In the present embodiment, the conducting film 30 is made of material selected from aluminum (Al), copper (Cu), chromium (Cr), tin (Sn), gold (Au), silver (Ag), nickel (Ni), and any suitable alloy thereof. The first seat portion 20 is electrically connected with the first connecting pad 23 by the plurality of through holes 16. In a typical application, the first connecting pad 23 is electrically connected to a printed circuit board (PCB, not shown), and so the first seat portion 20 is electrically grounded. Similarly, each of the second seat portions 22 is electrically connected with the corresponding second connecting portion 25 via the conducting film 30 coated on the inner wall of the corresponding through hole 16. In a typical application, the second connecting portions 25 are electrically connected to the PCB, and so the second seat portions 22 are electrically grounded.

The chip 50 is assembled on the substrate unit 10 and configured on the same surface of the substrate unit 10 with the metal members 40. In detail, the chip 50 is assembled on the first seat portion 20 via an adhesive 52, and electrically connected to the plurality of first bonding pads 21 by a plurality of bonding wires 54. In the present embodiment, the adhesive 52 may be a silver colloid; and the bonding wires 54 are made of material selected from gold, copper, aluminum, any suitable alloy thereof, and any other suitable electrically conductive material.

Each of the metal members 40 is securely assembled on and electrically connected with the corresponding second seat portion 22, and is grounded via the corresponding conducting film 30. In the illustrated embodiment, the metal members 40 are connected one by one to cooperatively form a frame-shaped metal block, which closely surrounds the chip 50. In other embodiments, the plurality of metal members 40 are a plurality of metal blocks evenly spaced from each other, or a plurality of grounded resistances. In such other embodiments, a distance between two adjacent metal members 40 is less than 5 millimeters.

The molding compound 60 covers the first surface 12 of the substrate unit 10 to encapsulate the plurality of first bonding pads 21, the chip 50 and the plurality of bonding wires 54, and to partially encapsulate each of the metal members 40. Since the molding compound 60 partially encapsulates each of the metal members 40, a bare portion 42 of each metal member 40 is exposed out of the molding compound 60. In the present embodiment, the molding compound 60 is made of electrically non-conductive material, such as black gum, plastic, etc.

In order to shield the chip 50 from electromagnetic radiation that may cause electromagnetic interference (EMI), the shielding layer 70 is applied to an outer surface of the molding compound 60 and the bare portions 42 of the metal members 40 to electrically connect the shielding layer 70 with the metal members 40. Thereby, the shielding layer 70 and the plurality of metal members 40 cooperatively shield the chip 50 from electromagnetic radiation that may cause EMI. In the present embodiment, the shielding layer 70 is made of material selected from aluminum (Al), copper (Cu), chromium (Cr), tin (Sn), gold (Au), silver (Ag), nickel (Ni), and any suitable alloy thereof.

Since the shielding layer 70 encapsulates the molding compound 60 and electrically connects with the metal films 30 via the plurality of metal members 40, the shielding layer 70 shields the chip 50 from electromagnetic radiation that may cause EMI. In addition, since the plurality of metal members 40 are mounted on the corresponding second seat portions 22 and around the chip 50 on the substrate unit 10, the plurality of metal members 40 and the shielding layer 70 cooperatively shield the chip 50 from electromagnetic radiation that may cause EMI.

The protection layer 80 is covered on an outer surface of the shielding layer 70 to prevent short-circuiting between the semiconductor chip package 100 and other components. The protection layer 80 is made of electrically non-conductive material, such as plastic, rubber, lacquer, glass, and the like. In the present embodiment, the protection layer 80 is made of a transparent electrically non-conductive material, such as transparent polyvinylchloride (PVC). The protection layer 80 may be manufactured by plating, vacuum printing, vacuum deposition, insert molding, spray coating, and the like.

FIG. 2A to FIG. 2E illustrate successive stages in an exemplary process of manufacturing the EMI shielded semiconductor chip package 100 in accordance with the present disclosure.

Figure 2A:
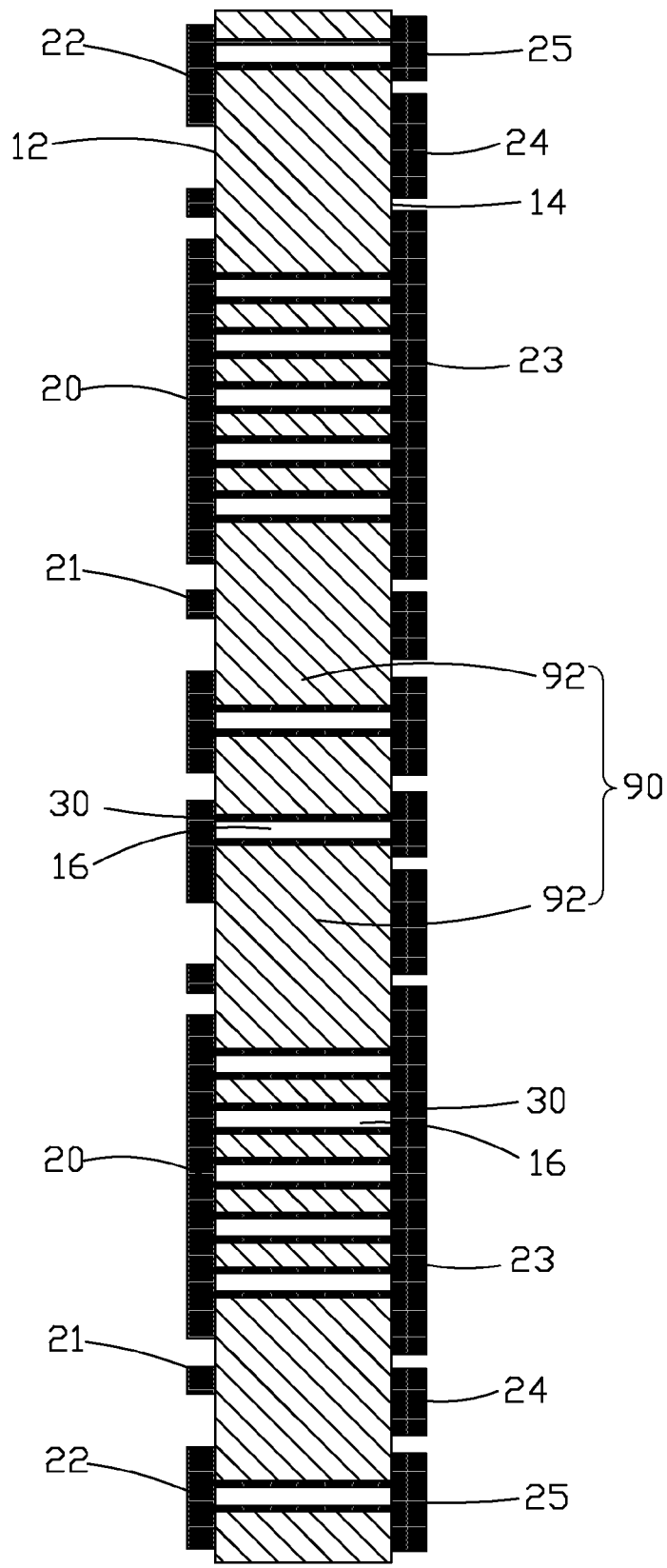
FIG. 2A to FIG. 2E illustrate successive stages in an exemplary process of manufacturing the EMI shielded semiconductor chip package in accordance with the present disclosure.

Referring to FIG. 2A, a substrate 90 is provided. The substrate 90 comprises a plurality of substrate units 92, and a first surface 12 and a second surface 14 at opposite sides thereof. In the following description, for simplicity, it will be assumed that there are only two substrate units 92. Each of the substrate units 92 comprises a first seat portion 20, a plurality of first bonding pads 21, a plurality of second seat portions 22, a first connecting portion 23, a plurality of second bonding pads 24 and a plurality of second connecting portions 25, and defines a plurality of through holes 16 passing through both the first surface 12 and the second surface 14. The plurality of first bonding pads 21 are positioned between the first seat portion 20 and the plurality of second seat portions 22, and surround the first seat portion 20 on the first surface 12. Similarly, the plurality of second bonding pads 24 are positioned between the first connecting portion 23 and the plurality of second connecting portions 25, and surround the first connecting portion 23 on the second surface 14. The first seat portion 20 is opposite to the first connecting portion 23, the plurality of first bonding pads 21 are respectively opposite to the corresponding second bonding pads 24, and the plurality of second seat portions 22 are respectively opposite to the corresponding second connecting portions 25.

A conducting film 30 is coated on an inner wall of each of the through holes 16. In the present embodiment, the conducting film 30 is made of material selected from aluminum (Al), copper (Cu), chromium (Cr), tin (Sn), gold (Au), silver (Ag), nickel (Ni), and any suitable alloy thereof. The first seat portion 20 is electrically connected with the first connecting pad 23 by the plurality of through holes 16 so that the first seat portion 20 is capable of being grounded. Similarly, each of the second seat portions 22 is electrically connected with the corresponding second connecting portion 25 via the conducting film 30 coated on the inner wall of the corresponding through hole 16 so that the second seat portion 22 is capable of being grounded.

Figure 2B:
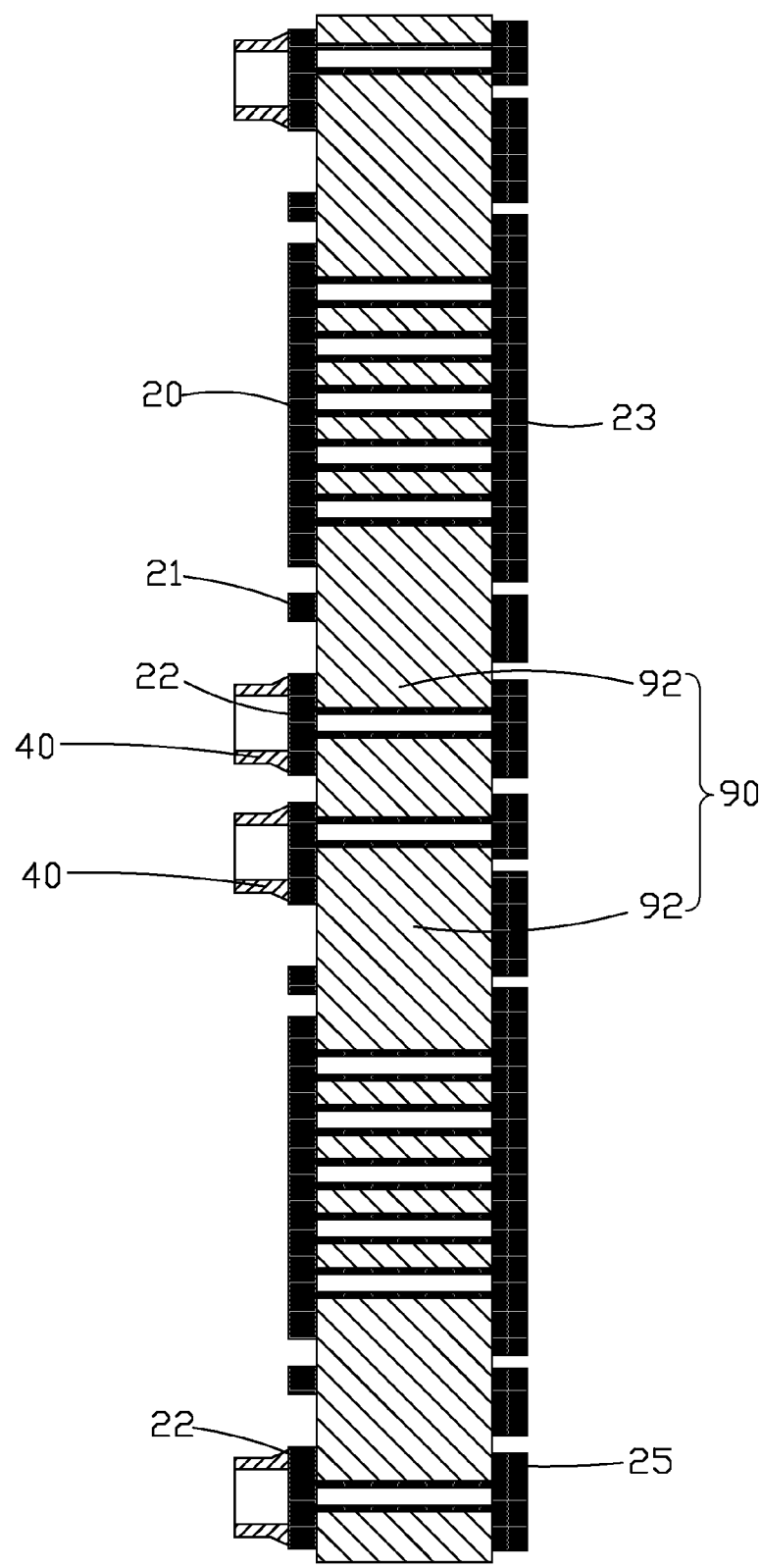

Referring to FIG. 2B, a plurality of metal members 40 are mounted on and electrically connected with the corresponding second seat portions 22, and are grounded via the corresponding second seat portions 22 electrically connecting with the metal films 30.

Figure 2C:
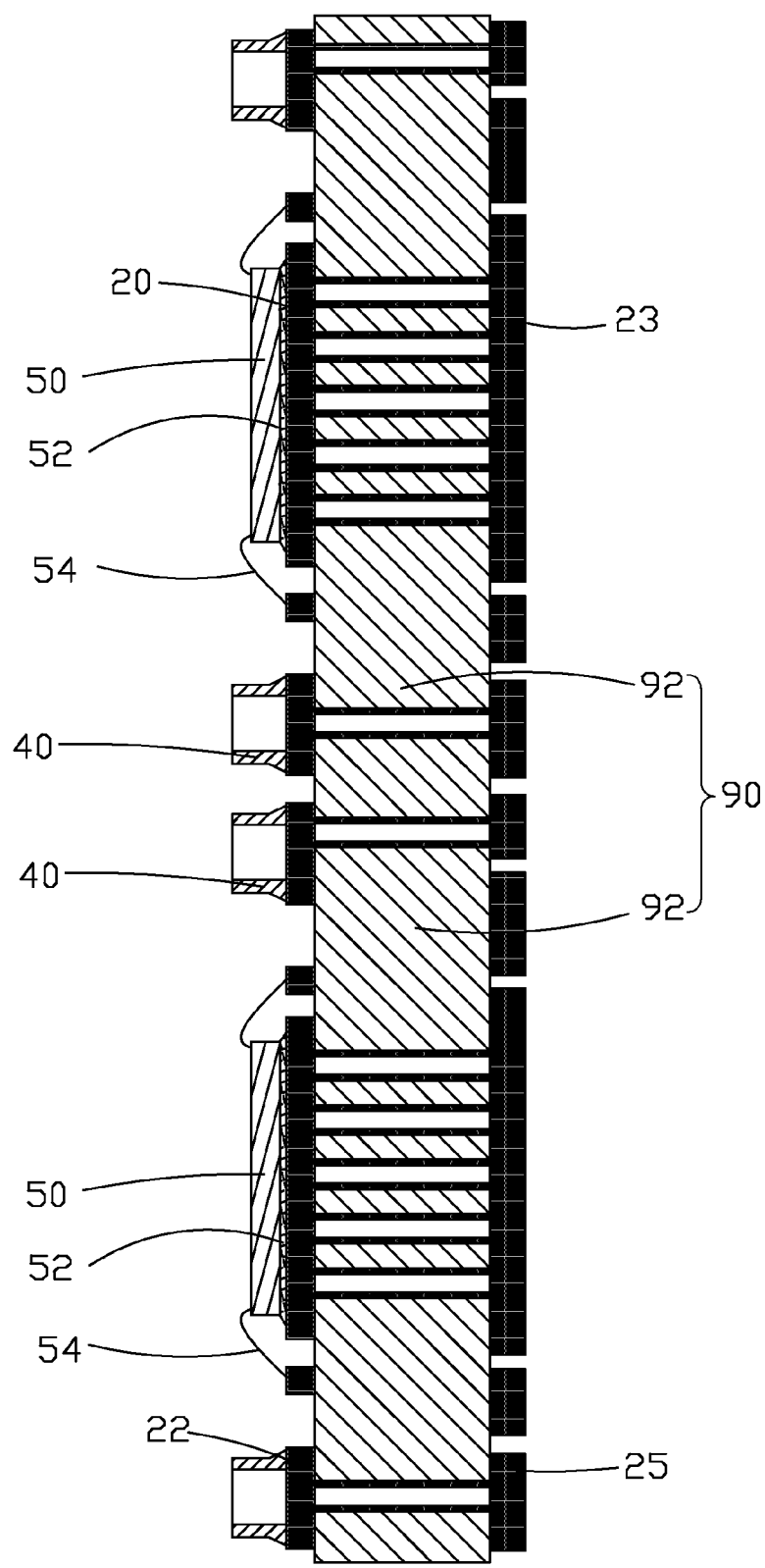

Referring to FIG. 2C, a plurality of chips 50 are assembled on the substrate 90. Each of the chips 50 corresponds to one substrate unit 92. Each chip 50 is surrounded by the corresponding plurality of metal members 40, is securely assembled on the corresponding first seat portion 20 via adhesive 52, and is electrically connected to the corresponding plurality of first bonding pads 21 via a plurality of bonding wires 54 to electrically connect the chip 50 with the corresponding substrate unit 92.

Figure 2D:
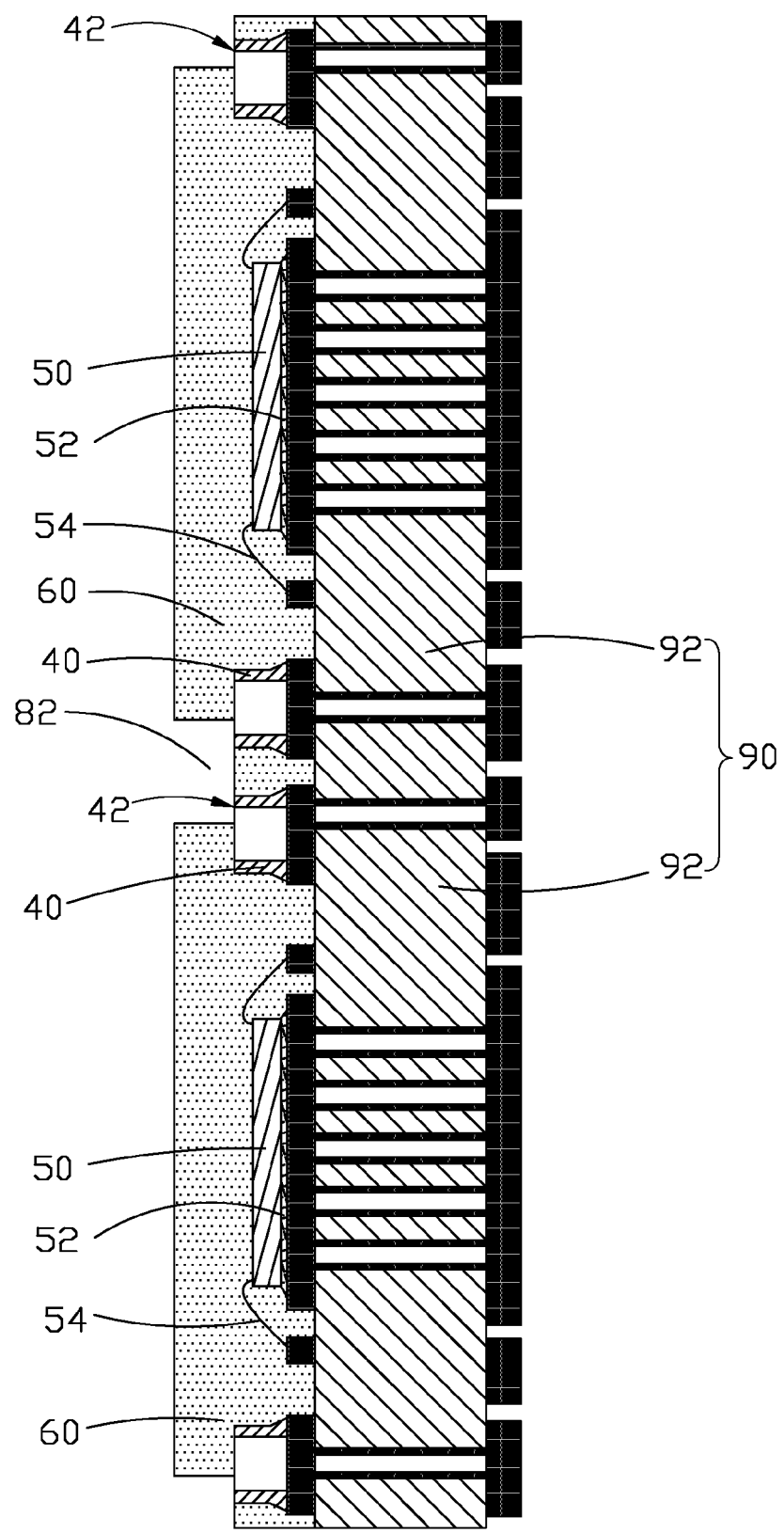

Referring to FIG. 2D, a molding compound 60 is formed on the substrate 90 to encapsulate the plurality of chips 50, the plurality of bonding wires 54 and the plurality of first bonding pads 21, and to partially encapsulate each of the metal members 40. A groove 82 is formed between the two contiguous substrate units 92 so as to expose bare portions 42 of the corresponding metal members 40 out of the molding compound 60. In the present embodiment, the molding compound 60 is made of electrically non-conductive material, such as black gum, plastic, etc. In the present embodiment, walls of the groove 82 form a substantially U-shaped configuration.

Figure 2E:
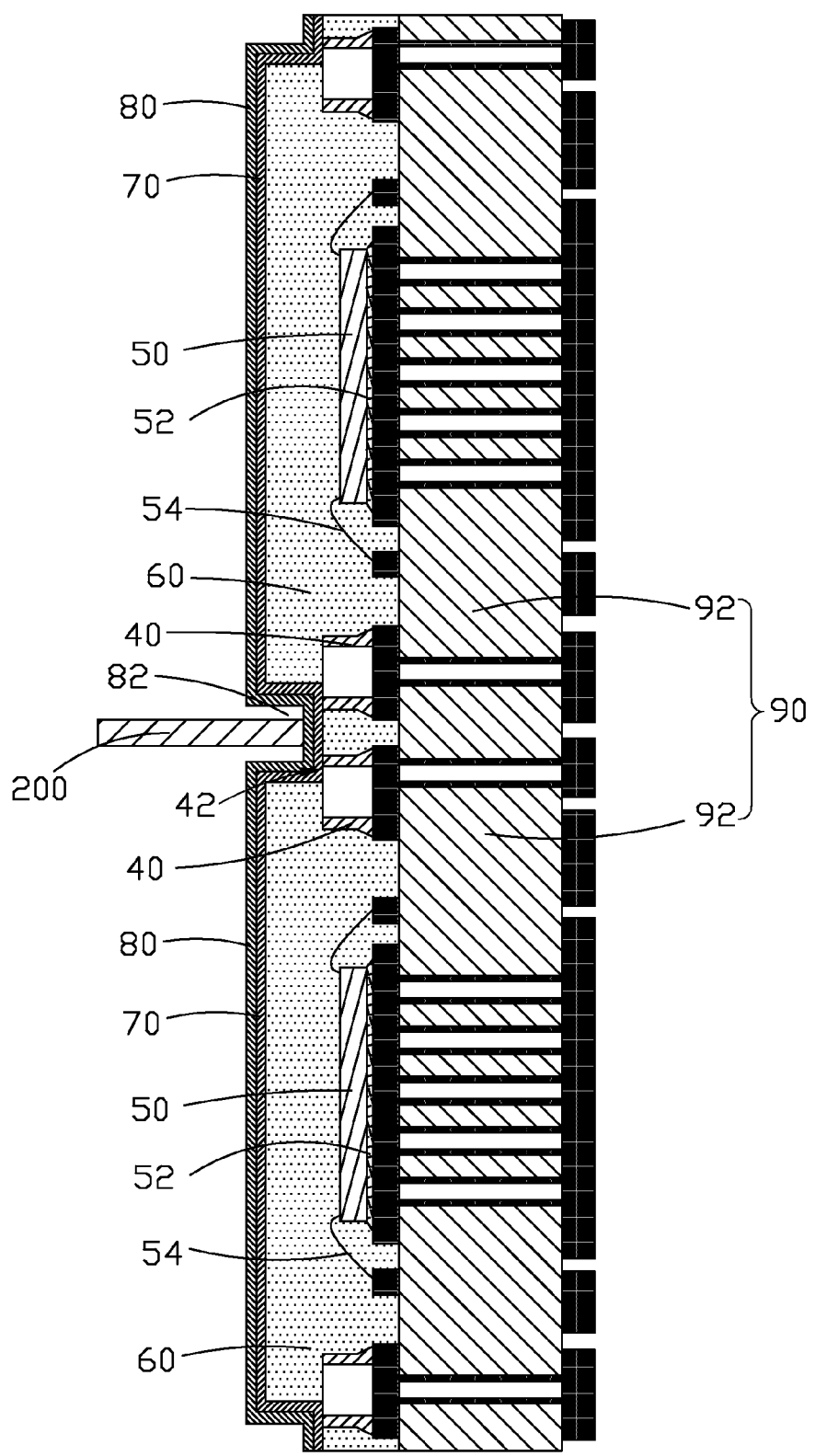

Referring to FIG. 2E, a shielding layer 70 is formed on an outer surface of the molding compound 60 and the bare portions 42 of the metal members 40 to cover the substrate 90, and is electrically connected with the bare portions 42 of the metal members 40 to shield the chips 50 from electromagnetic radiation that may cause EMI. In the illustrated embodiment, the shielding layer 70 is formed by chemical vapor deposition, electroless plating, electrolytic plating, spray coating, printing, or sputtering.

A protection layer 80 is formed on an outer surface of the shielding layer 70 to protect the shielding layer 70. The protection layer 80 is made of electrically non-conductive material, such as plastic, rubber, lacquer, glass, and the like. In the present embodiment, the protection layer 80 is made of a transparent electrically non-conductive material, such as transparent polyvinylchloride (PVC). The protection layer 80 may be formed by plating, vacuum printing, vacuum deposition, insert molding, spray coating, and the like.

A saw blade 200 is then used to cut the above-described assembly including the substrate 90 along the groove 82, to obtain a plurality of the EMI shielded semiconductor chip packages 100.

In the present disclosure, the molding compound 60 encapsulates the substrate 90 and forms the groove 82 between the contiguous semiconductor chip packages 100 to expose the bare portions 42 of the metal members 40 out of the molding compound 60. Hence there is no need to divide the substrate 90 into the plurality of substrate units 92 before performing the encapsulating process.

In the present disclosure, the bare portions 42 are exposed out of the molding compound 60 to be electrically connected with the shielding layer 70. Therefore, the shielding layer 70 and the metal members 40 cooperatively form a shielding structure to shield the chip 50 of each substrate unit 92 from electromagnetic radiation that may cause EMI, and there is no need to separately form the shielding layer 70 and the protection layer 80 for each substrate unit 92. This simplifies the production processes and reduces production costs.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A semiconductor chip package comprising:
    a substrate unit comprising an electrically conductive first seat portion and a plurality of electrically conductive second seat portions surrounding the first seat portion, the substrate unit defining a plurality of through holes each coated with electrically conducting film for electrically grounding the corresponding second seat portion;
    a chip assembled on the first seat portion and electrically connected with the substrate unit;
    a plurality of metal members assembled on the plurality of second seat portions and surrounding the chip, wherein the plurality of metal members are capable of being grounded via the conducting films;
    an electrically non-conductive molding compound encapsulating the chip and partially encapsulating the plurality of metal members with part of each of the metal members exposed out of the molding compound; and
    an electrically conductive shielding layer covering the molding compound and the part of each of the metal members exposed out of the molding compound to shield the chip from electromagnetic radiation.

2. The semiconductor chip package of claim 1, wherein the plurality of metal members are connected to cooperatively form a frame-shaped metal block, which closely surrounds the chip.

3. The semiconductor chip package of claim 1, wherein the plurality of metal members are evenly spaced from each other and a distance between two adjacent metal members is less than 5 millimeters.

4. The semiconductor chip package of claim 3, wherein each of the plurality of metal members is a grounded resistance.

5. The semiconductor chip package of claim 1, wherein the substrate unit further comprises a plurality of first bonding pads between the first seat portion and the second seat portions and a plurality of bonding wires are electrically connected between the chip and the corresponding first bonding pads to electrically connect the chip with the substrate unit.

6. The semiconductor chip package of claim 1, wherein the chip is assembled on the first seat portion via an adhesive.

7. The semiconductor chip package of claim 1, wherein the conducting film is made of material selected from the group consisting of aluminum, copper, chromium, tin, gold, silver, nickel and any alloy thereof.

8. The semiconductor chip package of claim 1, further comprising a protection layer which covers the shielding layer to protect the shielding layer.

9. A method of manufacturing a plurality of semiconductor chip packages, the method comprising:
    providing a substrate, the substrate comprising a plurality of substrate units each of which comprises a plurality of seat portions configured for grounding;
    assembling a plurality of metal members on the seat portions, each metal member corresponding to a seat portion;
    assembling a plurality of chips on the substrate units, each chip corresponding to a substrate unit with each chip being surrounded by a corresponding plurality of the metal members;
    forming an electrically non-conductive molding compound on the substrate to encapsulate the chips and partially encapsulate each of the metal members, wherein a part of each of the metal members is exposed out of the molding compound, wherein a groove is formed in the molding compound;
    forming a shielding layer on the molding compound and the parts of the metal members exposed out of the molding compound, the shielding layer being electrically connected with the metal members; and
    cutting the substrate along the groove to obtain a plurality of semiconductor chip packages.

10. The method of claim 9, wherein each chip is assembled on the corresponding substrate unit via an adhesive and electrically connected with the substrate unit by a plurality of bonding wires.

11. The method of claim 9, wherein each of the plurality of substrate units defines a plurality of through holes and a conducting film is coated on an inner wall of each of the plurality of through holes to ground the seat portions.

12. The method of claim 10, wherein the conducting film is selectively made of material selected from the group consisting of aluminum, copper, chromium, tin, gold, silver, nickel and any alloy thereof.

13. The method of claim 9, wherein walls of the groove form a substantially U-shaped configuration.

14. The method of claim 9, wherein the plurality of metal members are connected to form a metal block to closely surround the chip.

15. The method of claim 9, wherein the plurality of metal members are evenly spaced from each other and a distance between two adjacent metal members is less than 5 millimeters.

16. The method of claim 15, wherein each of the plurality of metal members is a grounded resistance.

17. The method of claim 9, wherein the molding compound is made of black gum or plastic.

18. The method of claim 9, wherein the shielding layer is formed by chemical vapor deposition, electroless plating, electrolytic plating, spray coating, printing, or sputtering.

19. The method of claim 9, wherein a protection layer covers the shielding layer to protect the shielding layer and the protection layer is made of a non-conductive material.

20. The method of claim 19, wherein the protection layer is formed by one of plating, vacuum printing, vacuum deposition, insert molding, and spray coating.

* * * * *